United States Patent
Gu (10) Patent No.: US 6,950,641 B2
(45) Date of Patent: Sep. 27, 2005

(54) APPARATUS, AND AN ASSOCIATED METHOD, FOR INCREASING RECEIVER SENSITIVITY OF A DIRECT CONVERSION RECEIVER

(75) Inventor: Qizheng Gu, San Diego, CA (US)

(73) Assignee: Nokia Corporation, Espoo (FI)

( * ) Notice: Subject to any disclaimer, the term of this patent is extended or adjusted under 35 U.S.C. 154(b) by 48 days.

(21) Appl. No.: 10/356,405

(22) Filed: Jan. 31, 2003

(65) Prior Publication Data

US 2004/0152432 A1 Aug. 5, 2004

(51) Int. Cl.⁷ ................................................. H04B 1/06
(52) U.S. Cl. ............................... 455/241.1; 455/250.1; 375/245
(58) Field of Search .......................... 455/232.1, 234.1, 455/235.1, 241.1, 250.1, 254.1, 312, 234.2, 254, 63.1, 67.11, 67.13, 226.1, 226.2, 226.3, 226.4; 375/345

(56) References Cited

U.S. PATENT DOCUMENTS

| | | | | |
|---|---|---|---|---|
| 4,313,215 A | * | 1/1982 | Jansen | 455/212 |
| 5,697,081 A | * | 12/1997 | Lyall et al. | 455/249.1 |
| 5,960,040 A | * | 9/1999 | Cai et al. | 375/279 |
| 6,498,927 B2 | * | 12/2002 | Kang et al. | 455/245.2 |
| 6,625,433 B1 | * | 9/2003 | Poirier et al. | 455/232.1 |
| 6,683,925 B1 | * | 1/2004 | Katsura et al. | 375/345 |
| 2003/0027538 A1 | * | 2/2003 | Masumoto et al. | 455/234.1 |
| 2003/0078007 A1 | * | 4/2003 | Parssinen et al. | 455/67.1 |
| 2003/0232609 A1 | * | 12/2003 | Yates | 455/232.1 |
| 2004/0043744 A1 | * | 3/2004 | Schlegel et al. | 455/324 |
| 2004/0092238 A1 | * | 5/2004 | Filipovic | 455/131 |

* cited by examiner

Primary Examiner—Nguyen T. Vo
Assistant Examiner—Nhan T. Le (57) ABSTRACT

Apparatus, and an associated method, for a direct conversion receiver by which to selectably increase the sensitivity of the receiver. The direct conversion receiver includes a baseband amplifier positioned in front of a baseband filter, and coupled to receive a direct-converted baseband signal. The gain at which the baseband amplifier amplifies the signal provided thereto is selected, in combination with gains applied to other amplification elements of the direct conversion receiver to distribute the gain across the receive chain. When a signal received at the receiver includes a large interfering signal component, the gain of the baseband amplifier is reduced to lessen the possibility that the amplified signal become saturated. A gain controller controls the gain of the amplification elements.

12 Claims, 3 Drawing Sheets

APPARATUS, AND AN ASSOCIATED METHOD, FOR INCREASING RECEIVER SENSITIVITY OF A DIRECT CONVERSION RECEIVER

The present invention relates generally to a manner by which to improve the performance of a direct conversion receiver, such as a direct conversion receiver used to form part of a mobile station operable in a cellular communication system. More particularly, the present invention relates to apparatus, and an associated method, for the direct conversion receiver that improves the sensitivity, or other signal characteristic, of the receiver.

An amplifier with special function is positioned at beginning of a baseband section of the direct conversion receiver. This baseband amplifier-amplifies a direct-converted, baseband signal applied thereto with a selected amplification level (or called as gain). The amplification level is selected mainly based on interference level to achieve high receiver sensitivity while also reducing the likelihood of, i.e. avoiding, occurrence of high-interference jamming receiver. When implemented in a cellular communication system, improved communications are provided, both due to the increased reception sensitivity and the reduced occurrence of high-intereference jamming that results in dropped calls.

BACKGROUND OF THE INVENTION

In a communication system, communication of data is effectuated between at least a pair of communication stations, one communication station forming a sending station and another of the communication stations forming a receiving station. The need to communicate data is regularly a necessary aspect of modern society. And, such need to communicate data shall likely become an even greater necessity in the future.

Different types of communication systems have been developed and have been utilized to communicate data pursuant to different types of communication services. As advancements in communication technologies are made available, such advancements have been implemented in existing communication systems. And, such advancements have permitted the implementation of new types of communication systems. A radio communication system is an exemplary type of communication system. The advancements in communication technologies have, for instance, been implemented in radio communication systems. And, new types of radio communication systems have been made possible as a result of such advancements in communication technologies.

A radio communication system differs with a conventional, wireline communication system in that a radio communication system utilizes radio links upon which to communicate data. More particularly, a communication path that extends between the sending and receiving stations of a radio communication system includes, at least along a portion thereof, a radio link. Radio channels are defined upon the radio link. And, at least for that portion of the communication path, data is communicated upon one or more radio channels. That is to say, a radio link is substituted for a wireline connection. And, when the radio link is substituted for the wireline connection, the need to use a wireline connection along that portion of the communication path is obviated.

Various advantages are provided through the use of a radio communication system. Costs associated with initial installation and initial deployment of a radio communication system are generally less than the corresponding costs of the installation and deployment of a wireline counterpart. And, a radio communication system can be implemented as a mobile communication system. In a mobile communication system, communication mobility is provided. One or more of the communication stations operable in a mobile communication system is mobile, i.e., permitted movement.

A type of mobile communication system that has achieved high levels of usage is a cellular communication system. A cellular communication system includes a network part, referred to as a network infrastructure, with which mobile stations communicate. The network infrastructures of cellular communication systems have been installed to encompass significant portions of the population centers of the world. Voice and, increasingly, data services are effectuated through the use of a cellular communication system. A cellular communication system is typically constructed in conformity with a standard, operational specification. Various cellular communication standards have been promulgated, and cellular communication systems that are operable pursuant to such cellular communication standards have been installed and implemented. Successive generations of communication standards have been promulgated. So-called, first-generation, second-generation, and third-generation communication standards have been promulgated. And, communication systems constructed to be operable in conformity with such communication standards have been installed, implemented, and popularly utilized. Additional, successor-generation standards are under development, and plans to install such systems are proposed.

Fixed-site, base transceiver stations form portions of the network infrastructures of cellular communication systems. The base transceiver stations are positioned at spaced intervals, and each base transeiver station defines a cell. Collectively, the cells together define the geographic area that is encompassed by the cellular communication system. When a mobile station, operable in active communications pursuant to effectuation of a communication service, travels between cells of the communication system, handovers are performed between base transceiver stations to permit continued communications to be carried out. Because communication handovers are performed, the power levels of communication signals that contain the data that is communicated between a mobile station and the network infrastructure are relatively low. And, as a result, the same frequencies can be used, according to a cell reuse scheme, within the communication system. The bandwidth allocated to a cellular communication system is efficiently utilized due to the ability to reuse the channel frequencies.

The mobile stations that are operable in a cellular communication system are formed of radio transceivers, including both transmit parts and receive parts. Mobile stations are packaged in increasingly smaller housings and regularly are of dimensions permitting their hand-carriage by a user. To permit the circuitry of the mobile station to be housed within the housing of such dimensions, the circuitry must correspondingly be of small dimensions. Careful selection of the circuitry of the transmit and receive portions of the mobile station is required so that the transceiver circuitry can be housed within the housing. The receive portions of the mobile station can, for example, be formed of heterodyne or super heterodyne architectures. Generally, such architectures, however, can not be implemented upon a single die and, instead, require the use of external filters. These off-chip components, and matched interfaces needed together therewith, limit the miniaturization permitted of the receive portion and also increase the complexity of the design and implementation of such receive portions.

Direct conversion architectures can instead be used. Direct conversion receivers are advantageous in that a direct conversion receiver is capable of single-chip integration. However, the reception sensitivity of a direct conversion receiver is generally less than that of a super heterodyne receiver that exhibits the same levels of current consumption. Because a direct conversion receiver does not utilize a passive channel filter, such as a SAW filter, to suppress unwanted signals or interference, the overall linearity of a direct conversion receiver is generally weaker than that of a super heterodyne receiver. To compensate for the reduced linearity of a direct conversion receiver, the receiver is sometimes constructed to exhibit reduced reception sensitivity. The reduced reception sensitivity limits the performance of a mobile station that incorporates a direct conversion receiver as the receive portion thereof.

If a manner could be found by which to provide an enhanced, direct conversion receiver architecture that provides higher reception sensitivity, without power consumption increase, and an improved capability to avoid high-interference jamming, improved communication performance of a direct conversion receiver would be provided. When implemented as part of a mobile station operable in a cellular, or other mobile, communication system, improved communication performance of the mobile station would correspondingly also be provided.

It is in light of this background information related to communications in a cellular, or other radio, communication system that the significant improvements of the present invention have evolved.

SUMMARY OF THE INVENTION

The present invention, accordingly, advantageously provides apparatus, and an associated method, by which to improve performance of a direct conversion receiver, such as a direct conversion receiver used to form part of a mobile station operable in a cellular, or other radio, communication system.

Through operation of an embodiment of the present invention, a manner is provided for the direct conversion receiver to improve the sensitivity, or other signal characteristic, of the receiver.

In one aspect of the present invention, a baseband amplifier is positioned at a baseband stage of the direct conversion receiver. A direct-converted, baseband signal is applied to the baseband amplifier. The baseband amplifier is of a selectable characteristic. That is to say, the gain, i.e., the amplification level, of the baseband amplifier is of a gain level selected responsive to the characteristics of the direct-converted, baseband signal applied thereto. The amplification level of the baseband amplifier is selected to increase the reception sensitivity, when possible, of the direct conversion receiver, or to avoid the likelihood of high-interference jamming and, at the same time, to keep a reasonably high sensitivity, without increase in power consumption levels.

In another aspect of the present invention, a direct conversion receiver is constructed to be of a high reception sensitivity design. The direct conversion receiver includes an RF (radio frequency) section that extends between an antenna port and an RF down-converter. The RF section is constructed to exhibit a gain that is as high as possible, e.g., between 27 and 30 dB. The RF section is constructed to exhibit selected linearity requirements resulting from current, or power, consumption constraints.

The direct conversion receiver also includes a baseband section to which a direct-converted, baseband signal, formed at the down-converter of the RF section is applied. The baseband amplifier forms a portion of the baseband stage, and the direct-converted baseband signal is applied thereto. The baseband stage also includes an active baseband filter, which is usually quite noisy. The amplification gain of the baseband amplifier is set high enough, for instance, 15 dB, to reduce the impact of the baseband filter on the overall receiver noise figure. This type of distribution between the RF section and the baseband section provides high reception sensitivity. For instance, using this gain distribution, the direct conversion receiver, implemented in a CDMA (code-division, multiple-access) mobile station, exhibits a sensitivity of (−109+/−) dBm reception sensitivity, a reception level that is similar to the sensitivity level of a super heterodyne CDMA receiver.

The baseband section also includes a variable gain amplifier that operates to amplify the baseband signal, once filtered by the baseband filter. The variable gain amplifier exhibits a variable level of gain. This variable gain amplifier, and a low noise amplifier the radio frequency section are together gain controlled by an automatic gain control mechanism, which is based on the measured power within the receiver channel bandwidth. The automatic gain control mechanism operates in a step-control manner responsive to the measured power level within the receiver channel bandwidth to control the gains of the variable gain amplifier and the low noise amplifier in the radio frequency section, and to maintain a voltage level within a tolerable range at the output thereof. The gain of the baseband amplifier is controlled based on another mechanism, at least when the direct conversion receiver, i.e., low noise amplifier in radio frequency section, is operating in a high-gain mode. When a determination is made that a strong interference or unwanted signal is delivered to the direct conversion receiver, and the direct conversion receiver is in a high gain mode, the gain of the baseband amplifier steps down. By stepping down the gain of the baseband amplifier, the baseband section of the direct conversion receiver is more likely to remain out of saturation, when a strong interference signal is present. Thereby, during normal conditions, i.e., when a desired, in-channel signal is much stronger than an interfering signal, the baseband amplifier operates at a gain, which makes the direct conversion receiver capable to operate at a very high sensitivity condition if needed. And, when a strong interfering signal is present, the gain of the baseband amplifier is reduced to avoid that the receiver becomes saturated.

Thereby, through operation of an embodiment of the present invention, the operational parameters of a direct conversion receiver approach, or are otherwise similar to, the parameters of a super heterodyne receiver while maintaining the advantages of a direct conversion receiver.

A more complete appreciation of the present invention and the scope thereof can be obtained from the accompanying drawings, which are briefly summarized below, the following detailed description of the presently-preferred embodiments of the present invention, and the appended claims.

DETAILED DESCRIPTION OF THE PREFERRED EMBODIMENT

Figure 1:
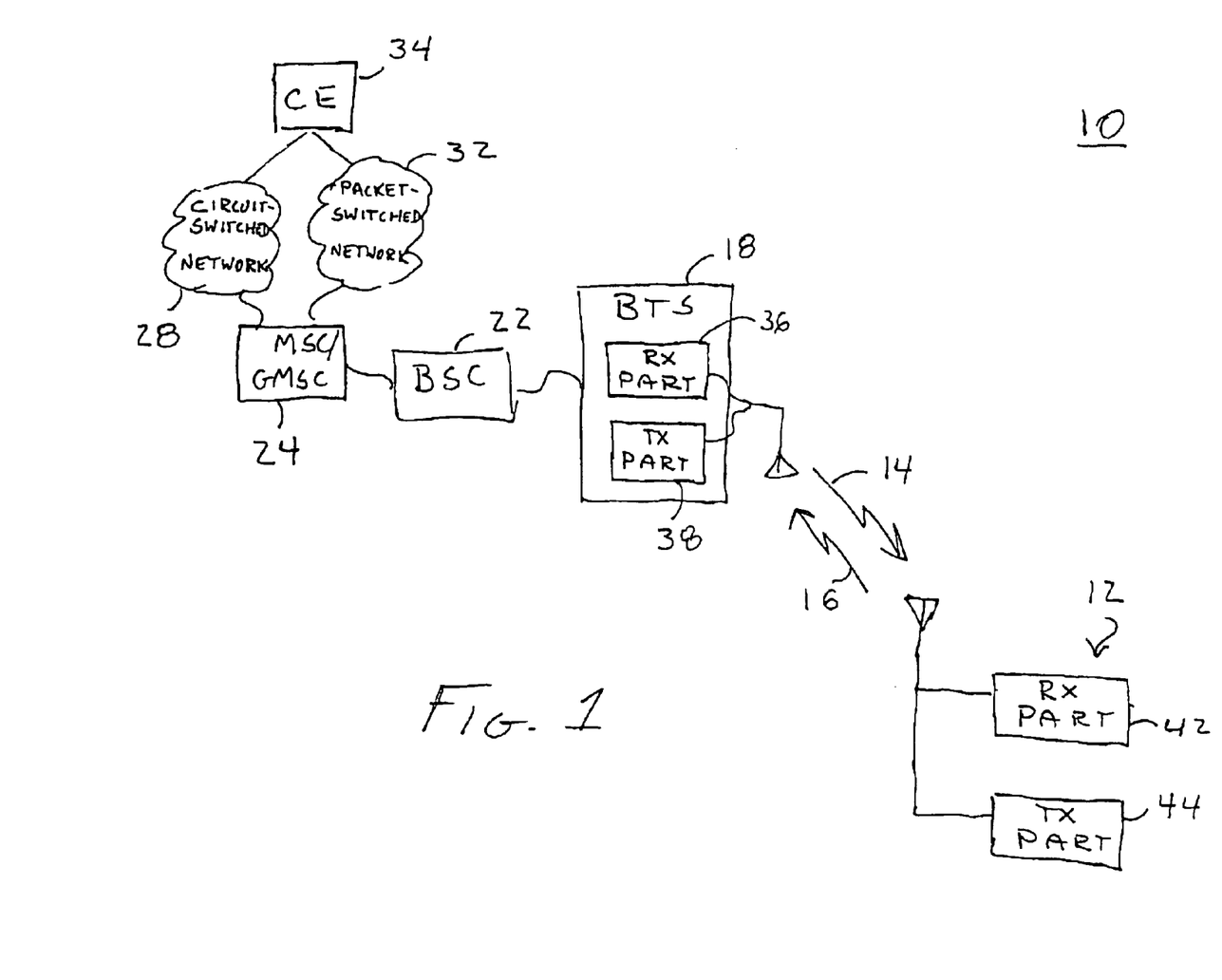
FIG. 1 illustrates a functional block diagram of a radio communication system in which an embodiment of the present invention is operable.

Referring first to FIG. 1, a mobile communication system, shown generally at 10, provides for communications between a fixed network and a mobile station, of which the mobile station 12 is representative. In the exemplary implementation shown in the Figure, the mobile communication system forms a cellular communication system. The cellular communication system is operable, and is constructed generally in conformity with, a selected cellular operational specification.

For instance, the mobile communication system is representative of a CDMA (code-division, multiple-access) cellular communication system, such as a CDMA system constructed pursuant to the operational specification of the IS-98 or CDMA 2000 standard. The mobile communication system 10 is also representative of cellular, and other radio, communication systems constructed in other manners, such as pursuant to a TDMA (time-division, multiple-access) communication scheme, e.g., such as that described in a GSM (Global System for Mobile communications) operational specification, or a variant thereof. And, more generally, the communication system is representative of any communication system in which a radio receiver is utilized, the radio receiver formed of a direct conversion receiver (DCR) architecture.

Accordingly, while the following description shall describe operation of an embodiment of the present invention with respect to its implementation in a cellular communication system that operates pursuant to a CDMA communication scheme, the present invention is analogously also operable in any of many other types of radio communication systems.

Communications with the mobile station 12 are effectuated by way of radio links formed between the mobile station and the network part of the communication system. Here, forward links 14 and reverse links 16 are represented. Data that is to be communicated to the mobile station is communicated upon radio channels, referred to as forward link channels defined upon the forward links 14. And, data communicated the mobile station to the network part is communicated upon radio channels, referred to as reverse link channels, defined upon the reverse links 16. Two-way communication of data with the mobile station is thereby provided.

The network part of the mobile communication system is functionally represented and is here shown to include a base transceiver station (BTS) 18 that transceivers data-containing communication signals upon radio channels defined upon the forward and reverse links 14 and 16.

The network part of the communication system further includes a base station controller (BSC) 22. A group of base transceiver stations, of which the base transceiver station 18 is representative, is typically coupled to a single base station controller. In turn, the base station controller is coupled to a mobile switching center/gateway mobile switching center (MSC/GMSC) 24. The mobile switching center/gateway mobile switching center, in turn, is coupled to networks 28 and 32. The network 28 is here representative of a circuit-switched network, such as a PSTN (public-switched, telephonic network). And, the network 32 is representative of a packet-switched network, such as the Internet. A correspondent entity (CE) is coupled to the networks 28 and 32 the correspondent entity is representative of a communication device, such as a telephonic station or a data server, that sources, or terminates data.

The base transceiver station includes a receive part 36 and a transmit part 38. And, the mobile station includes a receive part 42 and a transmit part 44. The receive parts of the base transceiver station and the mobile station, respectively, operate to receive, and to operate upon, data communicated to the respective elements of which the receive parts respectively form portions. And, the transmit parts of the base transceiver station and of the mobile station, respectively, operate to transmit data formed, or otherwise communicated, during operation of the communication system.

As noted previously, mobile stations are packaged in increasingly miniaturized packages. And, for the reason that a direct conversion receiver can be formed upon a single integrated circuit package, without need to utilize external, passive filter elements, the receive part 42 of the mobile station is sometimes formed of a direct conversion receiver architecture. And, here, the receive part 42 of the mobile station is formed of a direct conversion receiver. While the present invention shall be described with respect to a direct conversion receiver embodied at the mobile station 12 operable in the cellular communication system formed of the mobile communication system 10, the present invention is analogously implementable in any communication system that utilizes a direct conversion receiver and, more generally, in any direct conversion receiver. The receive part 36 of the base transceiver station 18, if desired, can also be formed of a direct conversion receiver pursuant to an embodiment of the present invention.

Figure 2:
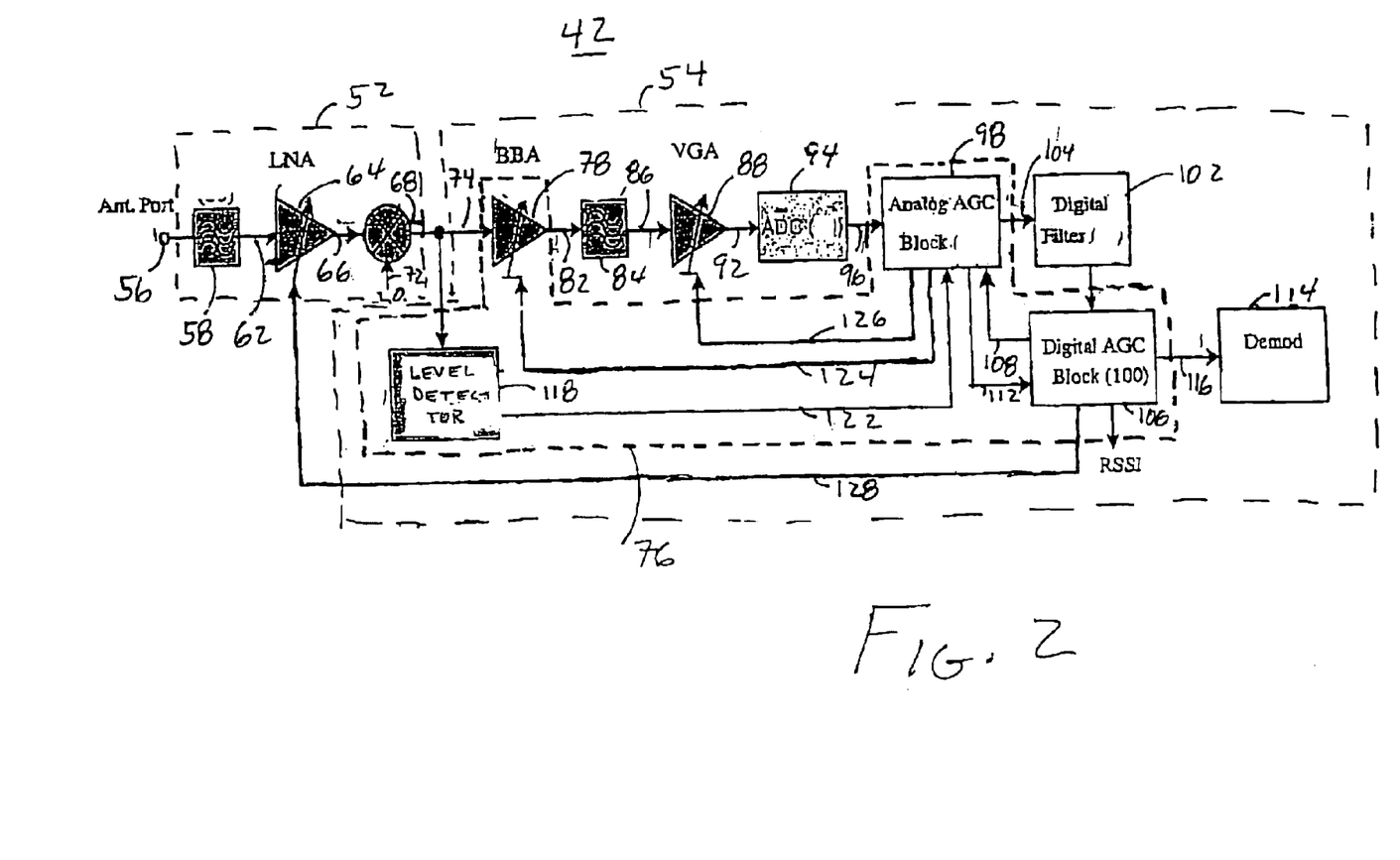
FIG. 2 illustrates a functional block diagram of a receive portion of a direct conversion receiver that includes an embodiment of the present invention as a portion thereof.

FIG. 2 illustrates the receive part 42 that forms a portion of the mobile station 12, shown in FIG. 1. The direct conversion receiver includes a first section 52 and a second section 54. The first section 52 is an RF (radio frequency) section, and the second section 54 forms a baseband section.

Signals communicated to the receiver are captured by an antenna (not shown) that converts electromagnetic energy into electrical energy. The antenna is connected to an antenna port 56. The antenna port, in turn, is coupled to a pre-selector filter 58 that operates to filter the electrical signals provided to the antenna port. And, in turn, the pre-selector filter is coupled, by way of a line 62, to a low noise amplifier (LNA) 64. The low noise amplifier exhibits a selectable gain level and operates to form RF-amplified signals on the line 66. The line 66 extends to a first input terminal of a down-mixer 68 and a down-mixing signal, generated by a local oscillator (LO), is provided to the down-mixer by way of the line 72. The down-mixer down-converts the signals provided thereto on the line 66 to a baseband level and generates direct-converted, baseband signals on the line 74.

The baseband stage 54 includes apparatus 76 of an embodiment of the present invention. The apparatus includes a baseband amplifier 78 to which the line 74 extends. The baseband amplifier operates selectably to amplify the direct-converted signals applied thereto on the line 74 at a selected gain level. And, first-amplified baseband signals are generated on the line 82 that extends to a baseband filter 84. The baseband filter filters the first-amplified signals provided thereto and forms filtered signals on the line 86 that extends to a variable gain amplifier 88. The variable gain amplifier amplifies the filtered signals provided thereto at a selected level of gain and generates second-amplified signals on the line 92.

The baseband stage 54 also includes an analog-to-digital converter 94 to which the second-amplified signal formed on the line 92 is applied. The analog-to-digital converter converts the signal applied thereto into digital form and provides digital representations thereof on the line 96 to an analog automatic gain control (AGC) device 98. The device 98 also forms a portion of the apparatus 76 of an embodiment of the present invention. The baseband stage is further shown to include a digital filter 102 that is coupled to the analog AGC device 98 by way of the line 104. And, the baseband stage further includes a digital automatic gain control (AGC) device 106 that also is coupled to the analog AGC by way of the lines 108 and 112. The digital AGC device 106 also forms a portion of the apparatus 76 of an embodiment of the present invention and is also coupled to a demodulator 114, here by way of the line 116.

The radio receiver also includes a level detector 118, here forming a portion of the baseband stage of the receiver and functionally also a part of the apparatus 76 of an embodiment of the present invention. The level detector detects indicia associated with the direct-converted, baseband signal generated on the line 74. And, indications of detections made by the level detector are provided by way of the line 122 to the analog AGC device 98. The gain control devices 98 and 106 are operable pursuant to an embodiment of the present invention to mainly control the gain levels of the amplifiers 64, and 88. Here, the analog AGC device 98 controls the gain levels of the amplifier 88, here by way of control line 126. And, the digital AGC device controls the gain level of the amplifier 64, here by way of a gain control line 128.

Selection of the amplifier 78 gain at which the amplifier 78 incorporating with other amplifiers amplifies signals provided thereto is made to distribute the gain across the various amplification elements in a desired manner and to—obtain a high receiver sensitivity, when possible, and to avoid the likelihood of saturation of the signal, when necessary.

For instance, when possible, the gain level of the front-end block 52 including the low noise amplifier 64 and the mixer 68 is set to be of a gain level within 25 to 30 dB. And the gain provided by the baseband amplifier 78 is selected to, e.g., 15 dB. In such a gain setting, a CDMA mobile receiver with direct conversion architecture will possess high sensitivity.

In the exemplary implementation, the baseband amplifier 78, which has a noise figure much lower than that of the high order baseband filter 84, exhibits a relatively high gain to facilitate the goal of high reception sensitivity. The baseband filter 84, forming a high order, active low pass filter, typically exhibits a relatively high noise figure that would otherwise severely impact the overall receiver sensitivity if there is no baseband buffering.

When the direct conversion receiver forming the receive part 42 is in a high gain mode, i.e., low noise amplifier 64 in high gain mode, and the level detector detects a strong level of interference, i.e., an interference level in excess of a selected threshold, the gain of the amplifier 78 is reduced, step-wise, a selected level of gain, such as to reduce the gain by six to nine dB. By reducing the gain of the amplifier 78, the likelihood of the saturation of the baseband amplifier 78 output is prevented. And, by preventing saturation of the signal, DCR jamming is avoided.

Even after the reduction in the gain of baseband amplifier by the 6 to 9 dB, or other, gain reduction, the reception sensitivity of the receiver must remain acceptably high. For example, when the receive portion 42 is constructed to be in conformity with the operational specification of an IS-98D standard, the reception sensitivity of the receive portion is equal to, or less than, −101 dBm under a −30 dBm, or higher, interference tone attack. Selection of the gains of the various amplification elements is made coordinately in the exemplary implementation. And, while the measurements made by the level detector, in the exemplary implementation, are taken of the signals generated on the line 74, the level detector, in other implementations, makes measurements and detections at other locations of the receive portion. For instance, in another implementation, the level detector makes measurements of signal or interfering signal values of the digital values generated on the line 96.

Even under a strong interference attack, the direct conversion receiver that includes that apparatus 76 of an embodiment of the present invention exhibits good static reception sensitivity. The receiver also advantageously reduces the current or power consumption required of the receiver.

The low noise amplifier 64, in one implementation, includes multiple gain steps, and, in the exemplary implementation, includes at least a high gain step and a low gain step. And, the level detector, in the exemplary implementation, determines the strength of interference and raises a flag if a detected level of interference is beyond a threshold. Also, the baseband amplifier, in one implementation, exhibits multi-steps of gain, controlled by the automatic gain control device 98 and includes, in the exemplary implementation, at least one step gain change, i.e., the capability of switching between a high gain level and a low gain level. Also, while the exemplary implementation utilizes the AGC device 98 by which to control the gain level of the baseband amplifier, in another implementation, such control is effectuated by the level detector. And, the level detector, at least in this implementation, forms a gain control mechanism.

The analog AGC device 98 functions conventionally to measure an overall received power level of the power input to the analog-to-digital converter 94 and also to maintain a voltage level of the voltage of the signal applied on the line 92 to the converter 94 is maintained at a constant level through control of the gain level of the amplifier 88. Pursuant to operation of an embodiment of the present invention, the control algorithm is modified based upon the level detector flag being raised, or not, by the level detector 118 and simultaneously to adjust the same amount of the amplification level of the baseband amplifier 78 and the amplifier 88, but in opposing directions. The analog AGC device, in the exemplary implementation, also informs the digital AGC device 106 about the overall receiver analog gain, $G_a$, measured at the device 98 and to also identify the flag condition of the level detector 118.

The digital AGC device 106 performs RSSI (received signal strength indicator) calculations of an in-channel bandwidth, based upon the analog gain of the receiver, $G_a$, the digital gain, $G_d$, which is the gain of a digital, variable gain amplifier embodied within the digital AGC device 106. The digital variable gain amplifier maintains a level constant Pd at the input of the demodulator 114. Thereby, the received, in-dash channel bandwidth power can be determined by the equation:

$$S_{in\text{-}dash\ channel} = P_d/(G_a - G_d)$$

The received signal strength indicator value is proportional to this in-channel bandwidth power. And, in the exemplary implementation, the AGC device 106 does not command the low noise amplifier 64 to step-down its gain if the level detector flag is raised.

The direct conversion receiver forming the receive part 42 is operable under various operating conditions. For instance, the direct conversion receiver is capable of operation in low-desired signal conditions when suddenly attacked by high levels of interference. Because the signal level is low, the receiver operates, initially, in a high gain mode. When the receiver is suddenly attacked by a strong interfering signal, the level detector raises its flag if the interference level is over a set threshold. When the analog AGC device 98 receives the flag signal flagged by the level detector by way of the line 122, the device 98 forces the baseband amplification gain of the amplifier 78 to drop ΔG, e.g., 6 dB and the gain of the amplifier 88 is raised a corresponding amount. The overall analog gain, $G_a$, is unchanged. The analog AGC device informs the digital AGC device 106 that the level detector flag is raised.

Prior to step-down of gain of the amplifier 78, the amplifier 78 may have been saturated by the sudden increase of interference. During this time, the distorted spectrum of the saturated interference extends into the channel bandwidth, and the in-channel bandwidth dramatically increases because of the extended interference spectrum. This may give the digital AGC device false information of the in-channel bandwidth desired signal power rise. The digital AGC device 106 attempts to command the LNA 64 gain step-down, but the level detector flag stops the sending of the gain change command to the low noise amplifier 64 for several symbol durations, determined, e.g., by circuit design, until the in-channel bandwidth interference power vanishes. The flag stops the sending of the gain control command to the low noise amplifier 64 is a just one-time action triggered by the raising of the flag. The in-channel bandwidth interference finally vanishes after the baseband amplifier 78 gain steps-down to the reduced dB level. When the interference disappears, or the strength of the interference reduces below the threshold of the level detector, the flag is lowered, and the analog AGC device 98 increases the gain of the baseband amplifier 78 and decreases the gain of the variable gain amplifier 88 by a corresponding amount. Thus, the receiver returns to normal operational conditions.

Another operating condition is a strong interference presence and the desired signal increasing over the low noise amplifier 64 gain switching level. In this situation, the receiver again is operating at a high gain level of the low noise amplifier 64 and a low gain mode of the baseband amplifier 78, initially. The in-channel bandwidth, desired signal power increases across the LNA 64 gain switching set point, and the digital AGC device 106 switches the gain of the amplifier 64 down $\Delta G_{LNA}$, e.g., 12 dB, and informs the analog AGC device 98 to adjust the gain of the amplifier 78 up a selected amount ΔG to its high gain level and the gain of the amplifier 88 to be decreased an amount of ($\Delta G_{LNA}$- ΔG) because the flag is raised. Thus, the voltage level at the input to the converter 94 is kept constant. Subsequent to all of the gain adjustments, the level detector flag is automatically lowered as the gain of the low noise amplifier is now low, and the interference level at the input of the level detector is below a threshold.

In another operating scenario, the receiver may be operated at a strong interference presence and the desired signal decreases to below the LNA 64 gain switching level. In this scenario, the receiver is operating at low gain levels of the amplifier 64 and high gain levels of the baseband amplifier 78, initially. The desired signal decrease to the point that the digital AGC device 106 executes an LNA 64 gain switch from low to high, i.e., increasing $\Delta G_{LNA}$, and the analog AGC device 98 reduces the VGA 88 gain by the same amount $\Delta G_{LNA}$ to keep the level at the input of the converter 94 within the tolerable range. However, after the gain of the amplifier 64 turns into a high level, the level detector flag is immediately raised as the amplifier 64 and the amplifier 78 both exhibit high gain during this period of time. Then AGC 98 forces the baseband amplifier 78 to reduce its gain ΔG dB, and, at mean while, increases the amplifier 88 gain by the same amount ΔG dB.

In another situation, the receiver is turned on with a low desired signal and high interference conditions. Here, the default setting of the receiver is assumed to be such that the amplifier 64 is in a high gain mode when the receiver is turned on. In this situation, the level detector raises the over threshold flag, and the analog AGC device 98 and the digital AGC device 106 exact the functional procedures as described above with respect to operation of the receiver in a low desired signal condition when suddenly attacked by interference.

In another situation, the direct conversion receiver is turned on with a high desired signal over the threshold of the level detector. In this situation, the level detector 118 again raises its flag. The analog AGC device 98 immediately adjusts the gain of the baseband amplifier 78 down ΔG dB and increases the gain of the variable gain amplifier 88 by a corresponding ΔG dB. Here, however, the digital AGC device 106 does not adjust the gain of the low noise amplifier 64 for several symbol durations after the flag is raised, as described above with respect to operation of the receiver in a low desired signal condition upon interference attack. If the in-channel bandwidth power remains at a high level subsequent to several symbol durations, then the digital AGC device 106 tunes the low noise amplifier 64 to a low gain or down $\Delta G_{LNA}$ dB. And, the analog AGC device adjusts the gain of the baseband amplifier up ΔG dB and the gain of the amplifier 88 is increased by $\Delta G_{LNA}$-ΔG dB as the flag is raised. The direct conversion receiver returns to its normal gain setting, and the flag of the level detector is lowered.

In another situation, the direct conversion receiver is turn on with high desired signal and also high interference. Here again, the control procedures correspond with those just-previously as the interference level at the level detector 118 is always lower than the threshold in the low gain mode of the low noise amplifier 64.

A hysteresis for the gain control of the baseband amplifier 78 may be applied, i.e., the thresholds of the level detector 118 for decreasing and increasing baseband amplifier gain should be set at different level. The threshold level for reducing the baseband gain should be a few dB higher than the level for increasing the gain.

Figure 3:
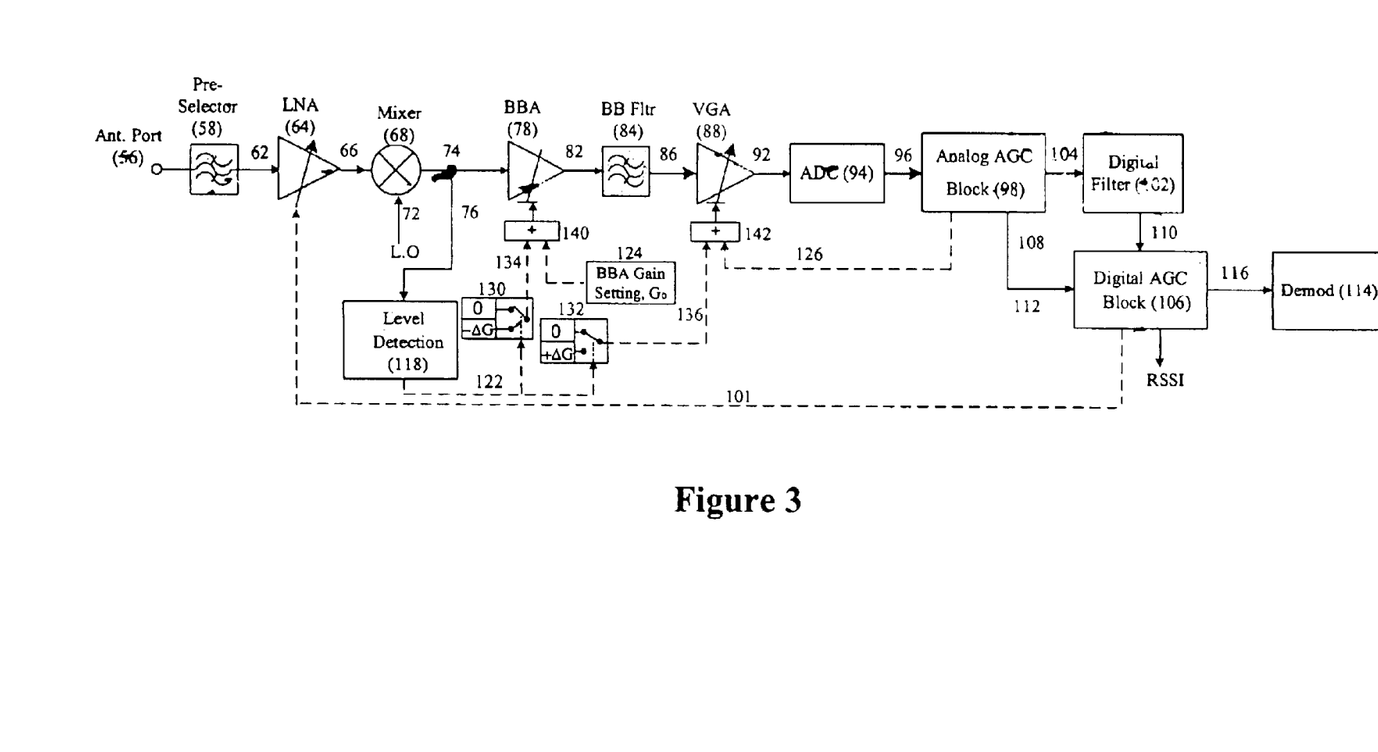
FIG. 3 illustrates an alternate functional block diagram, which has the same function as that of FIG. 2, but the control mechanism is simpler, of the direct conversion receiver that includes an embodiment of the present invention as a portion thereof.

An alternative approach, which can achieve the same function as performed by the direct conversion receiver architecture shown in FIG. 2, is presented in FIG. 3. In the normal condition, i.e., when a desired, in-channel signal is much stronger than an interfering signal, the baseband amplifier operates at a gain, which makes the direct conversion receiver capable to operate at a very high sensitivity condition if needed. And, when a strong interfering signal is present, the gain of the baseband amplifier is reduced to avoid that the receiver becomes saturated. The direct conversion receiver architecture presented in FIG. 3 uses almost the same main blocks as the previous one but the control mechanism of the baseband amplifier 78 gain and the function of some blocks, such as analog AGC 98 and level detector 118, associated with gain control are different.

In this architecture the baseband gain is controlled locally within the analog baseband section 54 instead of through analog AGC block 98. In the normal case, the registers 130 and 132 are set to value zero, and the baseband amplifier 78 gain is in its normal setting value $G_o$, which can make the direct conversion receiver capable to have a high reception sensitivity, and the VGA 88 gain is a value controlled by at the analog AGC 98 based the total signal level at the ADC input 96. When a very strong interference, whose level is beyond the level detector threshold, presents, the level detector 118 will trigger registers 130 and 132 and set them to a value $-\Delta G$ and $+\Delta G$, respectively. The value $-\Delta G$ in register 130 is added with the original setting value in BBA gain setting register 142 at adder 140 to form a control signal and to reduce the baseband amplifier gain to $G_o-\Delta G$. At the mean while, the value $+\Delta G$ in register 142 is added to the analog AGC control value at adder 142 to make VGA 88 increasing a gain $\Delta G$. Thus the receiver will not be jammed, but still have a reasonable high sensitivity as the FIG. 2 architecture does. However, in this architecture, the baseband gain control processing is seamless to the analog and digital AGC blocks 98 and 106.

In the different situations and/or scenarios as described previously, this architecture can accomplish the same function as done by FIG. 2. The similar descriptions, therefore, will not be repeated here. The control hysteresis of the baseband amplifier gain is also needed for this architecture.

Interference detection at the direct conversion receiver is detectable in various manners. As illustrated, the level detector, in the exemplary implementation, is coupled to the direct-converted baseband signal formed by the down-conversion mixer 68. In another implementation, the level detector is coupled to the line 92 positioned at the output terminal of the variable gain amplifier 88. Alternative methods are used to detect a strong interference.

For instance, interference is measurable based on the ratio of power measured at the analog AGC device 98 to power measured at the digital AGC device 106. Assume that the power at the input of the analog-to-digital converter 94 is $P_a$ and that it is within a tolerable range due to the automatic gain control. The desired signal, or in-channel, bandwidth power, $S_{in-channel}$ is proportional to the RSSI value. The ratio of $P_a$ and $P_d$ determines the interference level if the rejection of the baseband filter 84 to the interference varies within a certain range, e.g., 10 dB, while the interference has a different frequency. The value of R is represented as follows:

$R=10*\log(P_a/S_{in-channel})$ in dB.

The value of R is calibrated at the high gain mode of the low noise amplifier 64. And, a threshold is set, depending upon the DCR design to make the design work properly under strong interference attack. A power ratio comparator is employed in an analog/digital AGC device 98/106. Similar to the level detector 118, a flag (or a trigger) is raised if the value of R is over a set threshold. The reliability of this detection approach is dependent upon stop-band characteristics of the baseband filter 84. The fluctuation of the stop-band rejection is better if within a certain, e.g., 10 dB.

Alternatively, interference detection is based upon detection of a large dc offset change. The dc (direct current) offset in the analog baseband section of the receiver is usually very sensitive to the received overall power level. When the receiver suddenly suffers from a sudden interference attack, the dc offset level might surge within the baseband section 54 between the amplifiers 78 and 88 of the receiver. The large dc offset change is detected by circuitry in the analog baseband section 54 and it will be automatically compensated through operation of the variable gain amplifier circuit design. If the large dc offset variation is detected, then the dc offset detector raises a flag. The analog and digital AGC devices 98 and 106 determine if changing of the baseband amplifier 78 is to be made gain, or not, based upon the values of $S_{in-channel}$ or RSSI. The baseband amplifier 78 has its gain adjusted down to a low level of gain when the value of $S_{in-channel}$ or RSSI is low. Otherwise, the gain of the baseband amplifier is maintained at high.

In another implementation, interference is detected by a composition of these approaches.

The previous descriptions are of preferred examples for implementing the invention, and the scope of the invention should not necessarily be limited by this description. The scope of the present invention is defined by the following claims.

We claim:

1. A radio receiver for receiving a radio frequency signal, the radio receiver comprising:

a first-stage portion at which the radio frequency signal is amplified by a selected first-stage gain and direct-converted to a baseband frequency to form a baseband signal;

a second-stage portion to which the baseband signal, once converted to the baseband frequency is provided;

a first second-stage amplifier adapted to receive the baseband signal, once direct-converted at the first-stage portion to the baseband frequency, said first second-stage amplifier selectably for amplifying the baseband signal at a first selected level of gain such that the baseband signal, once amplified, is nonsaturated; and a gain controller coupled to said first second-stage amplifier and adapted to receive indicia comprising a noise-related value associated with the baseband signal, prior to amplification thereof at said first second-stage amplifier, said gain controller for selecting the selected level of gain by which said first second-stage amplifier amplifies the baseband signals, the selected level one of a first gain level and at least a second gain level, the first gain level greater than the second gain level, wherein said gain controller selects the selected level to be the second gain level when the noise-related value is beyond a selected threshold.

2. A radio receiver for receiving a radio frequency signal, the radio receiver comprising:

a first-stage portion at which the radio frequency signal is amplified by a selected first-stage gain and direct-converted to a baseband frequency to form a baseband signal;

a second-stage portion to which the baseband signal, once converted to the baseband frequency is provided;

a first second-stage amplifier adapted to receive the baseband signal, once direct-converted at the first-stage portion to the baseband frequency, said first second-stage amplifier selectably for amplifying the baseband signal at a first selected level of gain such that the baseband signal, once amplified, is nonsaturated;

a gain controller coupled to said first second-stage amplifier and adapted to receive indicia associated with the baseband signal, prior to amplification thereof at said first second-stage amplifier, said gain controller for selecting the selected level of gain by which said first second-stage amplifier amplifies the baseband signal; and wherein the selected first-stage gain by which the radio-frequency signal is amplified is selectably at least as great as a selected threshold, wherein said gain controller is further adapted to receive indications of the selected first-stage gain, and wherein said gain controller selects the selected level of gain by which said first second-stage amplifier amplifies the signal to be the second gain level when the selected first-stage gain is greater than the selected threshold.

3. The apparatus of claim 2 wherein the first-stage portion comprises a radio-frequency amplifier, and wherein said gain controller is further coupled to the radio-frequency stage amplifier, said gain controller further for selecting the selected first-stage gain of the radio-frequency stage amplifier.

4. The apparatus of claim 3 wherein said gain controller selects the selected first-stage gain of the radio frequency stage amplifier and the first selected level of gain of said first second-stage amplifier to distribute amplification levels there between to achieve at least a selected level of radio receiver sensitivity.

5. The apparatus of claim 3 wherein the second-stage portion further comprises a second, second-stage amplifier adapted to receive representations of the baseband signal, once amplified by said first second-stage amplifier, and to amplify the baseband signal at a second selected level of gain, wherein said gain controller is further coupled to the second second-stage amplifier, said gain controller further for selecting the second selected level of gain by which the second-stage amplifier amplifies the baseband signal.

6. The apparatus of claim 5, wherein said gain controller selects the selected first-stage gain of the radio-frequency stage amplifier, the first selected level of gain of said first second-stage amplifier, and the second selected level of gain of the second, second-stage amplifier to distribute amplification levels there between to achieve at least a selected level of radio receiver sensitivity.

7. The apparatus of claim 6 wherein the radio receiver forms a portion of a mobile station operable pursuant to a cellular IS-98 (Interim Standard-98) operating specification, and wherein the selected level of radio receiver sensitivity conforms to at least a minimal-required level set forth in the cellular IS-98 operating specification.

8. The apparatus of claim 5 wherein the second-stage portion further comprises a filter element and wherein said first second-stage amplifier and the second, second-stage amplifier are positioned in-line together with the filter element, said first, first-stage amplifier forming a prefilter amplifier and the second second-stage amplifier forming a post-filter amplifier.

9. The apparatus of claim 2 further comprising a level detector adapted to receive indications of the baseband signal, said level detector for forming the indicia associated with the baseband signal, said gain controller coupled to said level detector to receive the indicia formed thereat.

10. The apparatus of claim 9 wherein said level detector detects levels of interference in the baseband signal and wherein the indicia is of a first value when the levels of interference are beyond a selected threshold.

11. The apparatus of claim 10 wherein said level detector and said gain controller are embodied together and form a common element.

12. The apparatus of claim 2 wherein said gain controller comprises an analog gain control element.

* * * * *